(12) United States Patent
Koyama

(10) Patent No.: US 7,808,104 B2
(45) Date of Patent: Oct. 5, 2010

(54) SUBSTRATE FOR MOUNTING ELECTRONIC COMPONENT AND ELECTRONIC APPARATUS INCLUDING THE SUBSTRATE

(75) Inventor: Toshiki Koyama, Kanagawa (JP)

(73) Assignee: Sony Corporation (JP)

( * ) Notice: Subject to any disclaimer, the term of this patent is extended or adjusted under 35 U.S.C. 154(b) by 352 days.

(21) Appl. No.: 11/919,292

(22) PCT Filed: Mar. 31, 2006

(86) PCT No.: PCT/JP2006/306854
§ 371 (c)(1),
(2), (4) Date: Oct. 25, 2007

(87) PCT Pub. No.: WO2006/114986
PCT Pub. Date: Nov. 2, 2006

(65) Prior Publication Data
US 2009/0277675 A1    Nov. 12, 2009

(30) Foreign Application Priority Data
Apr. 25, 2005   (JP) .............................. 2005-125894

(51) Int. Cl.
*H01L 23/04* (2006.01)
(52) U.S. Cl. .............................. 257/730; 257/E23.001; 257/734; 257/686; 438/460; 331/68
(58) Field of Classification Search ............. 228/248.1, 228/180.22; 174/252; 257/600, E23.001, 257/E23.061, E21.499, E33.056; 331/68
See application file for complete search history.

(56) References Cited

U.S. PATENT DOCUMENTS 5,931,371 A * 8/1999 Pao et al. ............... 228/180.22

6,229,404 B1 * 5/2001 Hatanaka ..................... 331/68
6,441,312 B1 * 8/2002 Tanimura et al. ............. 174/252

(Continued)

FOREIGN PATENT DOCUMENTS

JP     05-183103 A    7/1993

(Continued)

*Primary Examiner*—Chris Chu
*Assistant Examiner*—Fang-Xing Jiang
(74) *Attorney, Agent, or Firm*—Lerner, David, Littenberg, Krumholz & Mentlik, LLP

(57) ABSTRACT

A recess (5a) in the corner direction and recesses (5b) in side directions are formed in each connecting pad (5A) located at a corner of a lower surface-side of an insulating base 2 having groove-shaped recesses (6) in the periphery, and groove-shaped recesses (6a and 6b) in the corner and side directions are formed in each corner portion (2A) of the insulating base 2 corresponding to the connecting pad (5A). Connecting pads (5) of an electronic apparatus in which an electronic component is mounted on the insulating base 2 are mounted on an external electrical circuit board by using a solder. A solder (31) melted during the solder-mounting adheres onto the groove-shaped recesses (6a and 6b) in the corner and side directions of the corner portion (2A) of the insulating base 2 and thus solder fillets are formed in the groove-shaped recesses (6a and 6b). Thus, solder bonding strength in the corners where external force is likely to work can be increased and the connecting pads of the wiring board can be firmly bonded to the lead conductors of the external electrical circuit board by using a hard and brittle lead-free solder.

9 Claims, 9 Drawing Sheets

U.S. PATENT DOCUMENTS

| | | | |
|---|---|---|---|
| 2002/0089039 A1* | 7/2002 | Wu | 257/600 |
| 2007/0221711 A1* | 9/2007 | Wada et al. | 228/248.1 |

FOREIGN PATENT DOCUMENTS

| | | |
|---|---|---|
| JP | 05-259306 A | 10/1993 |
| JP | 2003-068921 A | 3/2003 |
| JP | 2004-047866 A | 2/2004 |

* cited by examiner

SUBSTRATE FOR MOUNTING ELECTRONIC COMPONENT AND ELECTRONIC APPARATUS INCLUDING THE SUBSTRATE

TECHNICAL FIELD

The present invention relates to a wiring board for mounting an electronic component such as a semiconductor device and an electronic apparatus including the wiring board.

BACKGROUND ART

A known substrate for mounting electronic components and a known electronic apparatus including the substrate are described with reference to FIGS. 7A to 9. A known wiring board 1 for mounting electronic components such as semiconductor devices and piezoelectric vibrators is usually made of a ceramic material having a substantially rectangular shape and includes an insulating base 2 having an electronic component-mounting portion 4 in its upper face, a plurality of wiring layers 3 extending from the electronic component-mounting portion 4 of the insulating base 2 to the side surfaces through the interior of the insulating base, a plurality of connecting pads 5 formed on the peripheral portion of the lower surface of the insulating base 2, and a plurality of groove-shaped recesses 6 which are formed in side surfaces of the insulating base 2, which have conductors 7 adhered to the inner wall surfaces, and which electrically connect the wiring layers 3 to the connecting pads 5 through the conductors 7. An electronic apparatus 10 is made by mounting an electronic component such as a semiconductor device 11 on the electronic component-mounting portion 4 of the insulating base 2, electrically connecting electrodes such as signal and ground electrodes of the electronic component to the wiring layers 3 via conductive connecting members such as bonding wires 12, and then bonding a metal lid 13 composed of an iron-nickel-cobalt alloy, an iron-nickel alloy, or the like or a lid 13 composed of a light-transmitting material such as glass on the upper surface of the insulating base 2 by using a blazing material, an adhesive, or the like so as to cover and seal the electronic component.

The electronic apparatus 10 is mounted on an external electrical circuit board 20 by connecting the connecting pads 5 formed on the peripheral portion of the lower surface of the insulating base 2 to lead conductors 21 of the external electrical circuit board 20 by using a solder 31 such as a tin-lead solder or the like. Meanwhile, each of the electrodes of the electronic component is electrically connected to the external electrical circuit via the connecting pad 5, the conductor 7 on the internal wall surface of the groove-shaped recess 6, and the wiring layer 3. During this process, as shown in FIG. 5, the solder 31 in a molten state adheres onto the conductor 7 on the inner wall surface of the groove-shaped recess 6 to thereby form a solder fillet 32, which electrically connects the electronic apparatus 10 to the external electrical circuit board 20.

The groove-shaped recesses 6 onto which the conductors 7 adhere are formed in the side surfaces of the insulating base 2, usually have a semicircular cross-section and a uniform inner diameter, and extend in the vertical direction. The connecting pads 5 usually have a rectangular shape and are arranged at regular intervals over the entire peripheral portion of the lower surface of the insulating base while one side of each connecting pad is in alignment with the edge of the lower surface of the insulating base (e.g., refer to Japanese Unexamined Patent Application Publication No. 2003-68921).

DISCLOSURE OF INVENTION

However, the related art described above has the following problems.

In recent years, in order to avoid adverse effects on environment and human body, a so-called lead-free solder, such as tin-silver-bismuth or tin-silver-copper solder, is increasingly used instead of the tin-lead solder to connect various electronic apparatuses to external electrical circuit boards. This lead-free solder is harder and more brittle than the existing tin-lead solder.

After the electronic apparatus is mounted on the external electrical circuit board by connecting the connecting pads of the electronic apparatus to the lead conductors of the external electrical circuit board using the above-described lead-free solder, external stresses such as dropping impact may be applied to the electronic apparatus and the external electrical circuit board and stresses may be caused by mechanical deformation between the insulating base of the electronic apparatus and the external electrical circuit board. In such a case, mechanical breaking such as cracks and the like may occur in the solder bonding the connecting pads, and the reliability of connection between the electronic apparatus and the external electrical circuit board is impaired, which is a problem.

In particular, in the case where deformation of the external electrical circuit board caused by mechanical stresses occurs in the directions of the sides of the electronic apparatus, among the connecting pads disposed along each side of the electronic apparatus, pads located at the corners suffer from low bonding strength. This is because the groove-shaped recesses of these pads are located at the corners of the connecting pads, and as shown in FIGS. 10A and 10B (A-A cross-sectional view of FIG. 8A after mounting of the semiconductor device), the solder fillet 32 is not sufficiently formed in the directions of deformation of the substrate.

Moreover, from mechanical engineering standpoint, stresses concentrate at the pads located at the corners. Improving the reliability of these parts is crucial to improving the reliability of the electronic apparatus as a whole, in particular, an apparatus frequently dropped such as a cellular phone.

The present invention has been made to overcome the problem described above. An object of the present invention is to provide a wiring board that allows a connecting pad to securely bond to a lead conductor of an external electrical circuit board by using a lead-free solder so that the wiring board can be securely mounted on an external electrical circuit board with high reliability, and an electronic apparatus including such a wiring board.

In order to overcome the problem described above, the present invention provides a wiring board that includes an insulating base having an electronic component-mounting portion in an upper surface and having a connecting pad at least in a peripheral portion of a lower surface; and a groove-like recess formed in a side surface of the insulting base and extending in a vertical direction from the connecting pad in the peripheral portion, an inner wall surface of which has a conductor adhered thereon, in which a plurality of the groove-shaped recesses are provided per connecting pad in the peripheral portion.

In this manner, when the connecting pad is bonded to the lead conductor of the external electrical circuit by using a lead-free solder or the like, the solder creeps up the inner wall surface of each of the recesses to form fillets between the connecting pad and the lead conductor of the external electrical circuit board. Thus, the wiring board (electronic apparatus) can be extremely firmly bonded to the external electrical circuit board.

Moreover, even when external stresses such as dropping impact is applied to the electronic apparatus and the external electrical circuit board and stresses are caused by mechanical deformation between the insulating base of the electronic apparatus and the external electrical circuit board after the electronic apparatus is mounted on the external electrical circuit board by connecting the connecting pad of the electronic apparatus to the lead conductor of the external electrical circuit board using the lead-free solder or the like, mechanical breaking of the lead-free solder bonded to the connecting pad can be effectively prevented. This is because fillets are formed in the connecting pad and the groove-like recesses in the direction of application of these stresses. Thus, the reliability of the connection between the electronic apparatus and the external electrical circuit board can be notably enhanced.

ADVANTAGES

According to the present invention, a wiring board includes an insulating base having an electronic component-mounting portion in an upper surface and having a connecting pad at least in a peripheral portion of a lower surface; and a groove-like recess formed in a side surface of the insluting base and extending in a vertical direction from the connecting pad in the peripheral portion, an inner wall surface of which has a conductor adhered thereon, in which a plurality of the groove-shaped recesses are provided per connecting pad in the peripheral portion. Thus, when the connecting pad is bonded onto the lead conductor of the external electrical circuit by using a lead-free solder or the like, the solder creeps up the inner wall surface of each recess to form solder fillets between the connecting pad and the lead conductor of the external electrical circuit. As a result, the electronic apparatus can be notably firmly bonded to the external electrical circuit board.

Moreover, even when external stresses such as dropping impact is applied to the electronic apparatus and the external electrical circuit board and stresses are caused by mechanical deformation between the insulating base of the electronic apparatus and the external electrical circuit board after the electronic apparatus is mounted on the external electrical circuit board by connecting the connecting pad of the electronic apparatus to the lead conductor of the external electrical circuit board using the lead-free solder or the like, mechanical breaking of the lead-free solder bonded to the connecting pad can be effectively prevented. This is because fillets are formed in the connecting pad and the groove-like recesses in the direction of application of these stresses. Thus, the reliability of the connection between the electronic apparatus and the external electrical circuit board can be notably enhanced.

BEST MODE FOR CARRYING OUT THE INVENTION

Embodiments of the present invention will now be described in detail with reference to FIGS. 1A to 4.

Figure 1A:
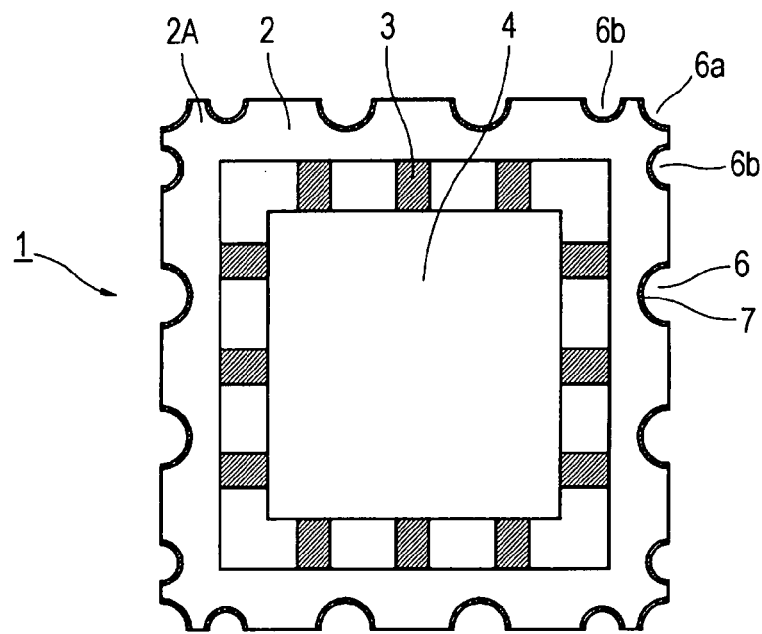
FIG. 1A is an example of a top view of a wiring board of the present invention applied to a semiconductor device package for packaging a semiconductor device.
Figure 1B:
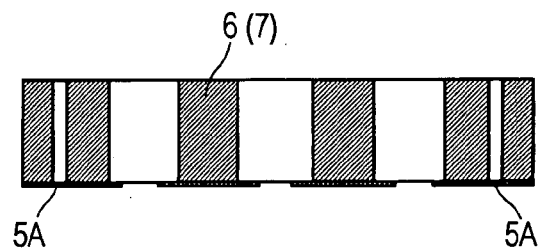
FIG. 1B is an example of a side view of the wiring board of the present invention applied to a semiconductor device package for packaging a semiconductor device.
Figure 1C:
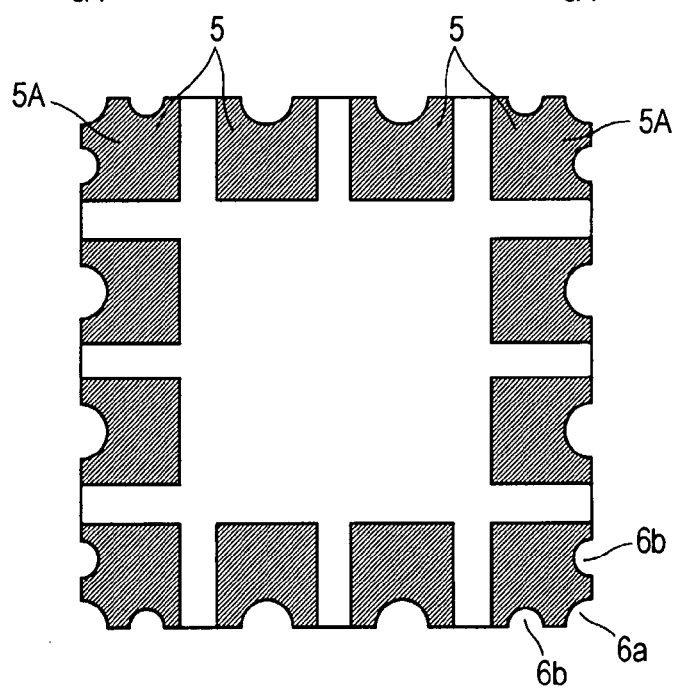
FIG. 1C is an example of a bottom view of the wiring board of the present invention applied to a semiconductor device package for packaging a semiconductor device.
Figure 2A:
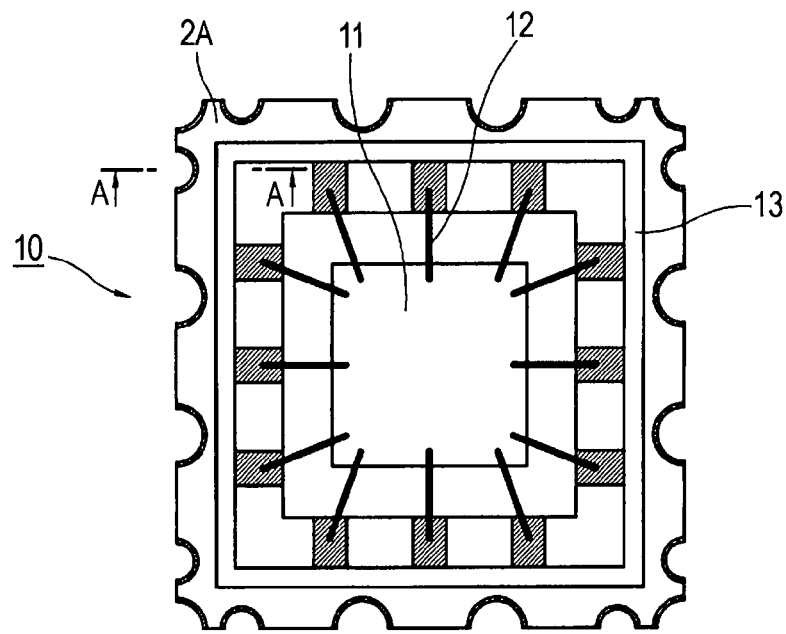
FIG. 2A is an example of a top view of a semiconductor apparatus in which a semiconductor device is mounted on the wiring board of the present invention.
Figure 2B:
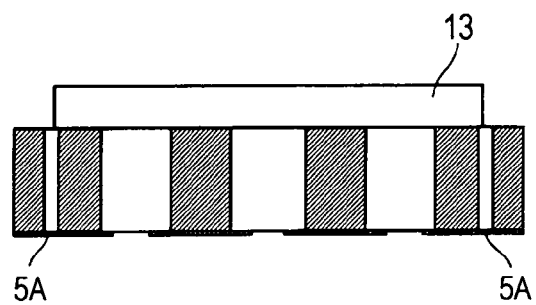
FIG. 2B is an example of a side view of the semiconductor apparatus in which the semiconductor device is mounted on the wiring board of the present invention.
Figure 2C:
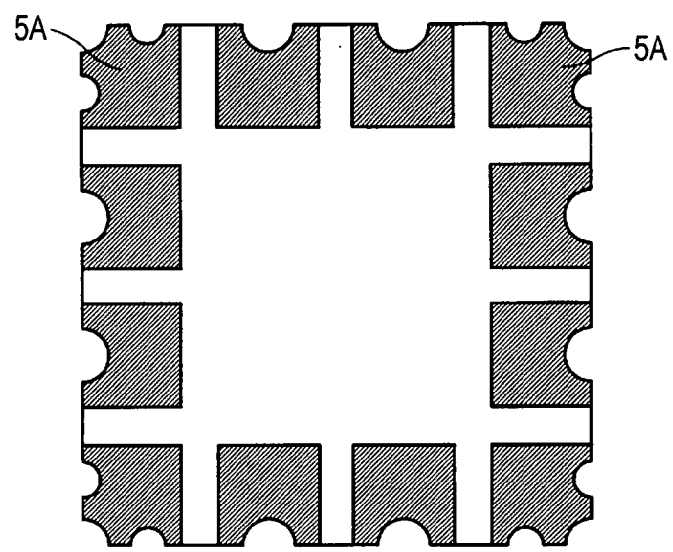
FIG. 2C is an example of a bottom view of the semiconductor apparatus in which the semiconductor device is mounted on the wiring board of the present invention.
Figure 3:
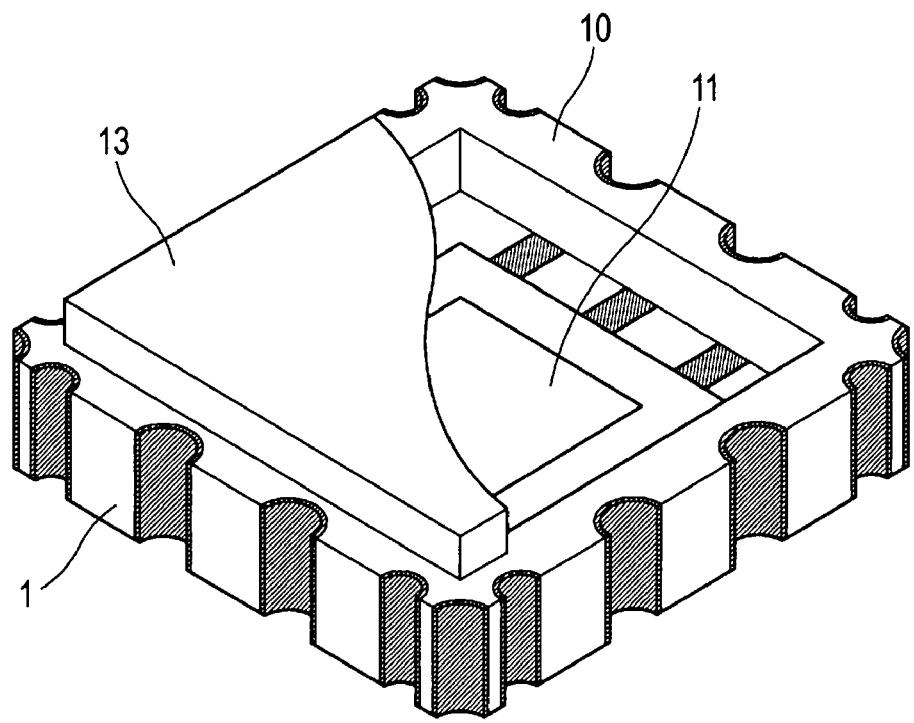
FIG. 3 is a schematic perspective diagram showing a semiconductor apparatus.
Figure 4:
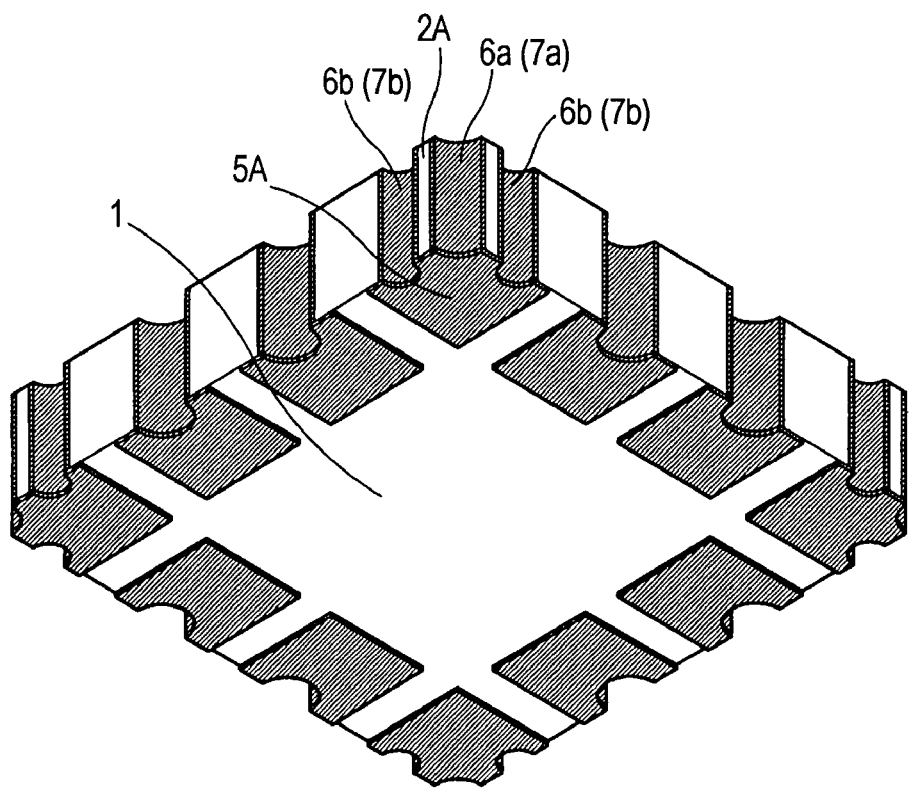
FIG. 4 is an enlarged perspective view of a corner portion of the wiring board viewed from a rear surface-side.

FIGS. 1A to 1C show an example of applying a wiring board of the present invention to a semiconductor device package for packaging a semiconductor device. FIGS. 2A to 2C show an example of a semiconductor apparatus in which a semiconductor device is mounted on a wiring board. FIG. 3 is a schematic perspective view of the semiconductor apparatus, and FIG. 4 is an enlarged perspective view of a corner portion of the wiring board from the rear surface-side.

In FIGS. 1A to 2C, reference numeral 2 denotes an insulating base, 3 denotes a wiring layer, 4 denotes an electronic component-mounting portion, 5 denotes a connecting pad 5, and 6 denotes a groove-shaped recess formed in a side surface of the insulating base 2 and having a conductor 7 formed on its inner wall surface. The insulating base 2, the wiring layers 3, the electronic component-mounting portion 4, the connecting pads 5 and the groove-shaped recesses 6 make a wiring board 1 for mounting the semiconductor device 11.

The insulating base 2 is composed of an electrically insulating material such as an aluminum oxide sinter, an aluminum nitride sinter, a mullite sinter, and a glass ceramic sinter. The mounting portion 4 for mounting the semiconductor device 11 is provided in the upper surface of the insulating base 2, and the semiconductor device 11 is fixed on the mounting portion 4 using a bonding agent such as glass, resin, blazing material, or the like.

In order to make the insulating base 2 from an aluminum oxide sinter, for example, ingredient powders such as aluminum oxide, silicon oxide, calcium oxide, magnesium oxide, and the like are mixed with an appropriate organic binder or solvent to prepare a ceramic slurry, and the ceramic slurry is formed into sheets by a sheet-forming technique such as a commonly known doctor blade technique or calendar roll technique so as to obtain ceramic green sheets of a predetermined shape. Lastly, the ceramic green sheets are stacked and fired at a temperature of about 1600° C. in a reducing atmosphere.

The insulating base 2 has wiring layers 3 extending from the periphery of the mounting portion in the upper surface of the insulating base 2 where the semiconductor device 11 is to be mounted to the side surfaces through the interior of the insulating base 2. The wiring layers 3 function as conduction paths for connecting the signal and ground electrodes of the semiconductor device 11 mounted on the electronic component-mounting portion 4 to the connecting pads 5. An end of each wiring layer 3 at the electronic component-mounting portion 4-side is electrically connected to an electrode for signals, ground, or the like through a bonding wire 12.

The wiring layer 3 is composed of metal powder such as tungsten, molybdenum, manganese, copper, silver, gold, or palladium. A metal paste prepared by mixing an appropriate organic binder or solvent with metal powder such as tungsten or the like is applied in advance by a known screen-printing technique so as to form predetermined patterns on ceramic green sheets for the insulating base 2. In this manner, the wiring layers 3 can be formed to extend from the upper surface of the insulating base 2 to the side surface while penetrating the interior of the insulating base 2.

The connecting pads 5 are formed on the peripheral portion of the lower surface of the insulating base 2 and are connected to the lead conductors of the external electrical circuit board through a lead-free solder so that the connecting pads 5 electrically connect the signal and ground electrodes of the semiconductor device 11 to the external electrical circuit.

The connecting pads 5 are made of metal powder such as tungsten, molybdenum, manganese, copper, silver, gold, palladium, or the like, and formed to have a predetermined shape on the peripheral portion of the lower surface of the insulating base 2 by the same method as with the wiring layers 3.

The insulating base 2 has a plurality of groove-shaped recesses 6 (usually having a semicircular cross-section) in the side surfaces. The conductor 7 is disposed on the inner wall surface of each groove-shaped recess 6. The conductor on the inner wall surface of the groove-shaped recess 6 has a function of electrically connecting the wiring layer 3 to the connecting pad 5.

The conductor on the inner wall surface of the groove-shaped recess 6 is composed of metal powder such as tungsten, molybdenum, manganese, copper, silver, gold, palladium, or the like. The conductors are formed into a predetermined shape on the side surface of the insulating base 2 by forming semicircular recesses in the side surfaces of the ceramic green sheets, which will make the insulating base 2, by punching or the like and applying in advance a metal paste prepared by adding an appropriate organic binder or solvent to metal powder such as tungsten so that predetermined patterns are formed in the recesses.

In this invention, as shown in FIG. 1C, each of connecting pads 5A located at the lower surface-side corners of the insulating base 2 has not only a recess 5a in the corner direction but also recesses 5b in side directions. A corner portion 2A of the insulating base 2 that corresponds to the connecting pad 5A has not only a groove-shaped recess 6a in the corner direction but also groove-like recesses 6b in side directions.

Referring now to FIGS. 2A to 2C, the semiconductor device 11 is mounted on the mounting portion 4 in the upper surface of the insulating base 2, the signal and ground electrodes of the semiconductor device 11 are connected to the wiring layers 3 through the bonding wires 12, and then the semiconductor device 11 is hermetically sealed with the lid 13 over the upper surface of the insulating base 2. The electronic component 10, which is a semiconductor apparatus product, is made thereby.

The semiconductor apparatus 10 is mounted on the external electrical circuit board 20 by connecting the connecting pads 5 in the peripheral portion of the lower surface of the insulating base 2 to the lead conductors 21 of the external electrical circuit board 20 by using the solder 31. As a result, the signal and ground electrodes of the semiconductor device 11 are electrically connected to the lead conductors 21 of the external electrical circuit board 20.

Figure 5:
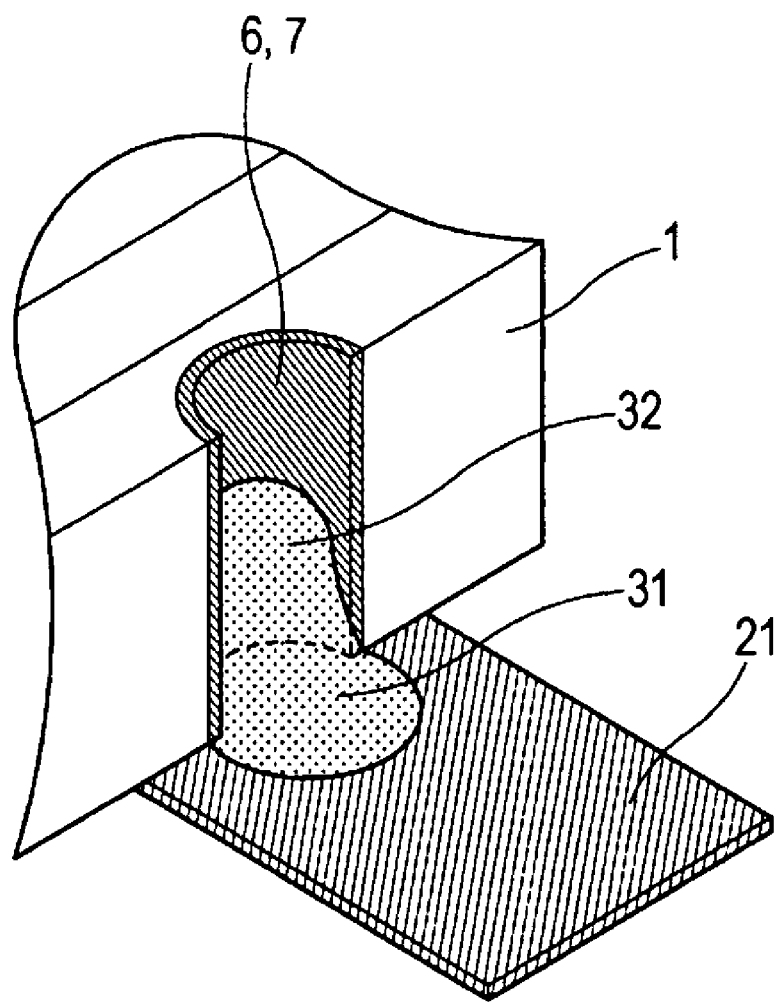
FIG. 5 is a perspective view showing a solder fillet formed in the recess of the wiring board of the semiconductor apparatus mounted on an external electrical circuit board.
Figure 6A:
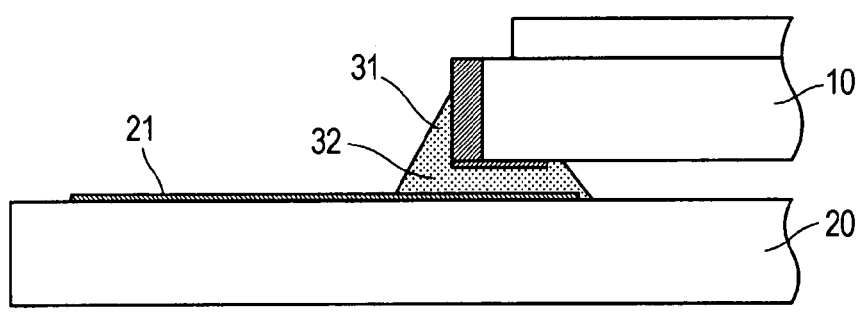
FIG. 6A is an A-A cross-sectional view of FIG. 2A after the semiconductor apparatus is mounted on an external electrical circuit board.
Figure 6B:
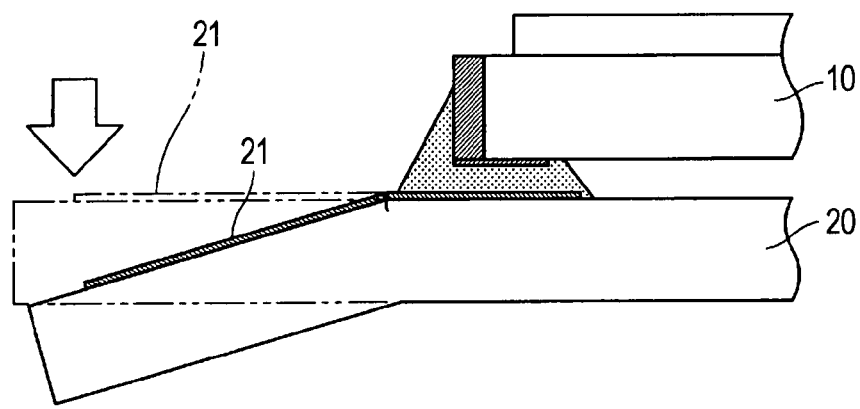
FIG. 6B is an A-A cross-sectional view of FIG. 2A after the semiconductor apparatus is mounted on an external electrical circuit board.
Figure 7A:
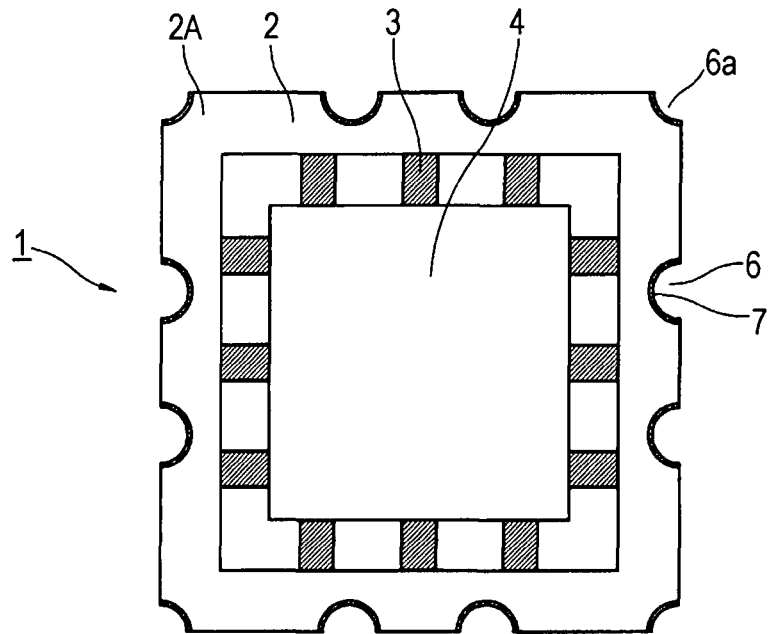
FIG. 7A is an example of a top view of a semiconductor apparatus in which a semiconductor device is mounted on a known wiring board.
Figure 7B:
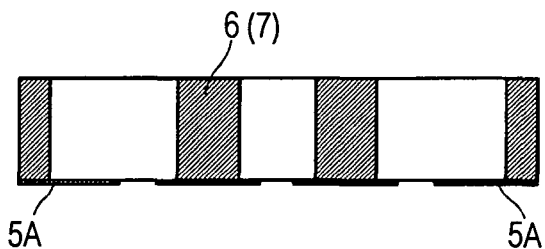
FIG. 7B is an example of a side view of the semiconductor apparatus in which the semiconductor device is mounted on the known wiring board.
Figure 7C:
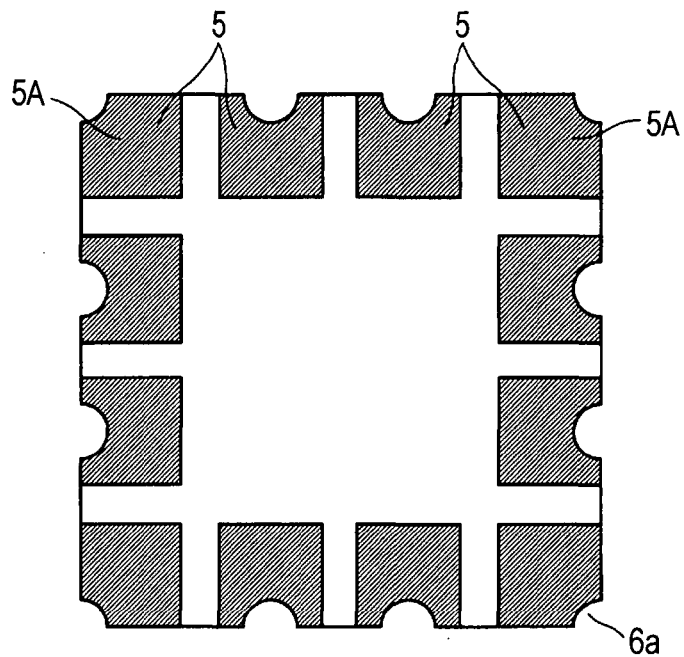
FIG. 7C is an example of a bottom view of the semiconductor apparatus in which the semiconductor device is mounted on the known wiring board.
Figure 8A:
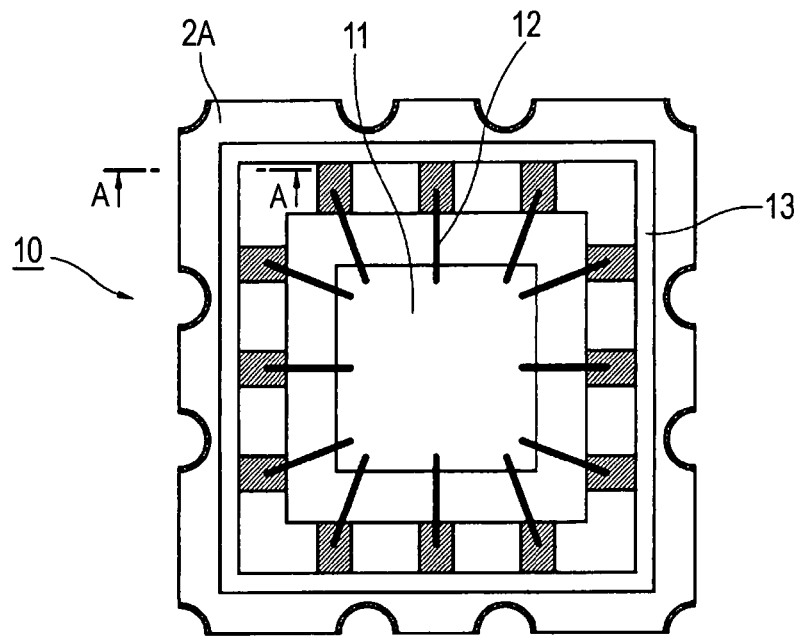
FIG. 8A is an example of a top view of a semiconductor apparatus in which a semiconductor device is mounted on a known wiring board.
Figure 8B:
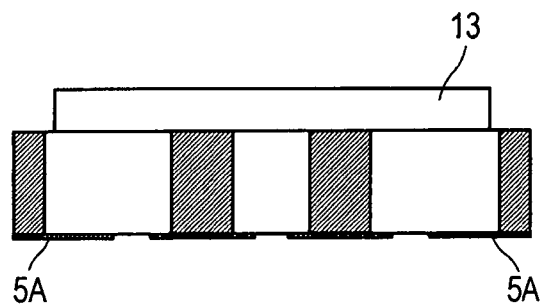
FIG. 8B is an example of a side view of the semiconductor apparatus in which the semiconductor device is mounted on the known wiring board.
Figure 8C:
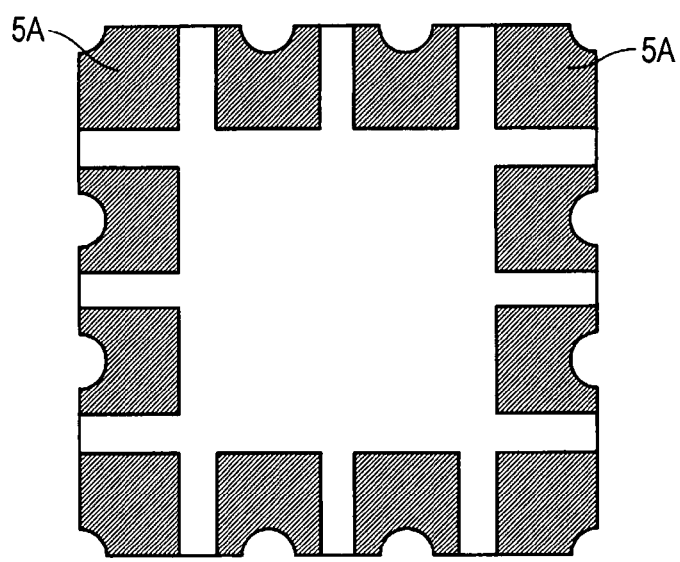
FIG. 8C is an example of a bottom view of the semiconductor apparatus in which the semiconductor device is mounted on the known wiring board.
Figure 9:
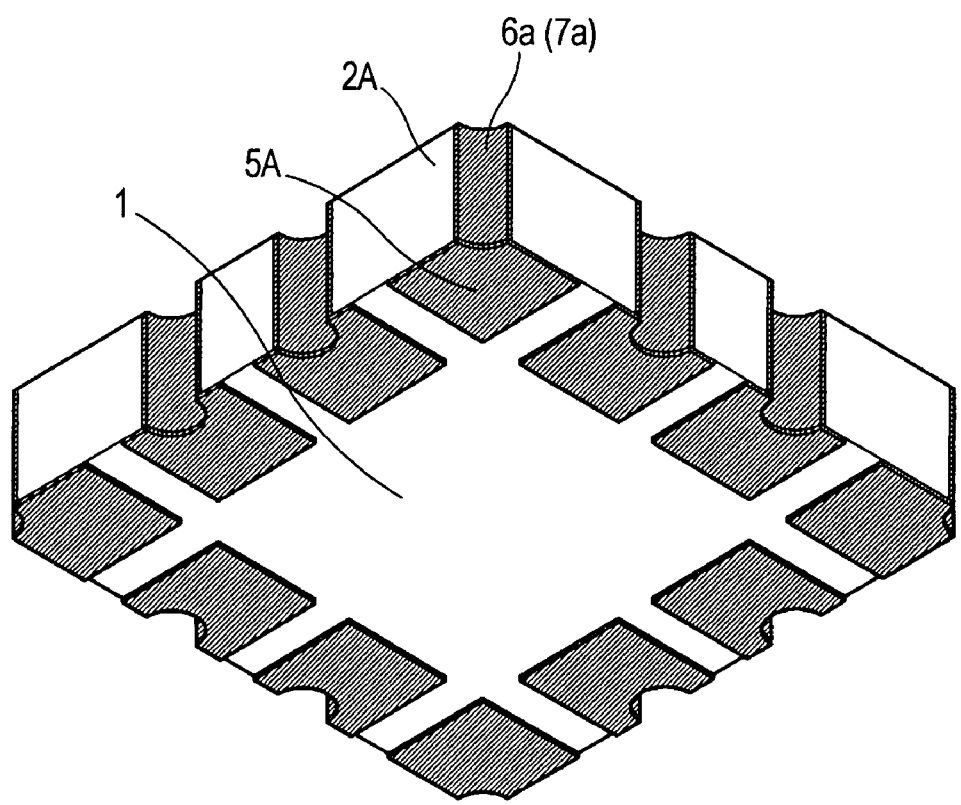
FIG. 9 is an enlarged perspective view of a corner portion of a wiring board viewed from the rear surface-side.
Figure 10A:
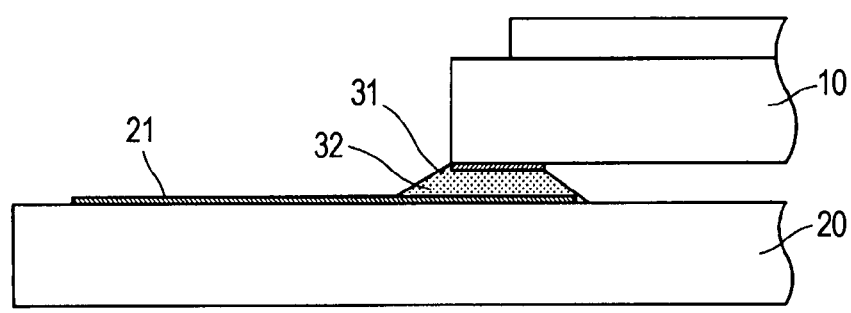
FIG. 10A is an A-A cross-sectional view of FIG. 8A after a semiconductor device is mounted on an external electrical circuit board.
Figure 10B:
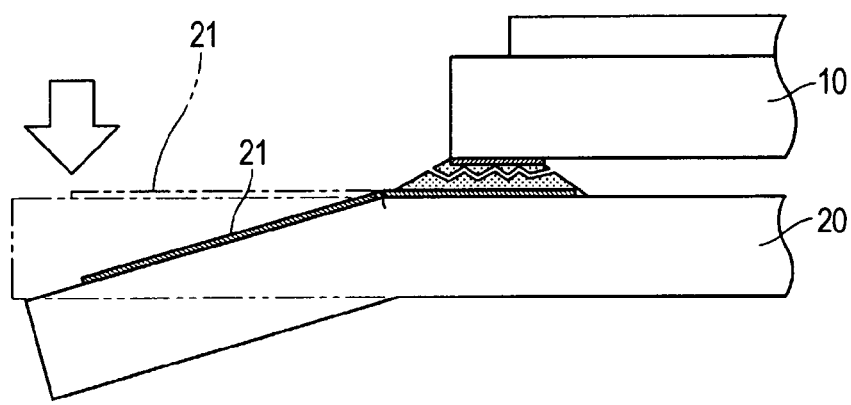
FIG. 10B is an A-A cross-sectional view of FIG. 8A after a semiconductor device is mounted on an external electrical circuit board.

According to this invention, because not only the recesses 5a in the corner directions but also the recesses 5b in the side directions are formed in the connecting pads 5A located at the corners of the insulating base 2 and because not only the recesses (groove-like recesses) 6a in the corner directions but also the recesses (groove-like recesses) 6b in the side directions are formed in the corner portions 2A of the insulating base 2 corresponding to the connecting pads 5A, the solder 31 melted during solder mounting adheres on the groove-like recesses 6b in the side directions and forms solder fillets 32 also in the recesses 6b as shown in FIG. 5.

Consequently, a sufficient amount of solder can be supplied between the lead conductors 21 of the external electrical circuit board 20 and the connecting pads 5A in the corners, and the wiring board 1 of the electronic apparatus 10 can be extremely firmly bonded to the external electrical circuit board 20.

Thus, when mechanical stresses, such as dropping impact, are applied to the electronic apparatus 10 and the external electrical circuit board 20 and stresses caused by mechanical deformation between the insulating base 2 of the electronic apparatus 10 and the external electrical circuit board 20 occur, although the stresses are applied mainly to the solder that bonds the external electrical circuit board 20 to the connecting pads 5A in the corners that lie in the directions of application of the stresses, mechanical breaking of the lead-free solder that bonds the connecting pads 5 can be effectively prevented and the reliability of the connection between the electronic apparatus 10 and the external electrical circuit board 20 can be significantly enhanced. This is because the solder fillets 32 are formed in the groove-shaped recesses 6a and 6b in the corner and side directions for the connecting pads 5A that lie in the directions of application of the stresses.

The present invention is not limited to the above-described embodiments and various modifications are possible without departing from the scope of the present invention. For example, although the wiring board of the present invention is applied to the semiconductor device package for packaging a semiconductor device in the above-described embodiment, it may be applied to other usages such as a hybrid integrated circuit board or the like.

The material of the insulating base is not limited to a ceramic and may be an organic material such as glass epoxy or polyimide.

The invention claimed is:

1. A wiring board, comprising:
an insulating base having an electronic component-mounting portion in an upper surface and having a number of connecting pads at least in a peripheral portion of a lower surface; and a number of groove-like recesses each formed in the insulting base and extending in a vertical direction from a connecting pad in the peripheral portion, an inner wall surface of which has a conductor adhered thereon,
in which a respective connecting pad located in a corner has more than one groove-like recess formed therein which includes a groove-like recess located in the respective corner thereof.

2. A functional module wherein an electronic component is mounted on the wiring board of claim 1.

3. A package for packaging a semiconductor device, comprising:
an insulating base having a recess for accommodating the semiconductor device and a number of connecting pads at least in a peripheral portion of a lower surface; and a number of groove-like recesses each formed in the insulting base and extending in a vertical direction from a connecting pad in the peripheral portion, an inner wall surface of which has a conductor adhered thereon,
in which a respective connecting pad located in a corner has more than one groove-like recess formed therein which includes a groove-like recess located in the respective corner thereof.

4. A semiconductor apparatus wherein a semiconductor device is mounted in the package for packaging the semiconductor device of claim 3.

5. A package for packaging an electronic apparatus, comprising:
an insulating base having a recess for accommodating the electronic apparatus and a number of connecting pads at least in a peripheral portion of a lower surface; and a number of groove-like recesses each formed in the insulting base and extending in a vertical direction from a connecting pad in the peripheral portion, an inner wall surface of which has a conductor adhered thereon,
in which a respective connecting pad located in a corner has more than one groove-like recess formed therein which includes a groove-like recess located in the respective corner thereof.

6. An electronic apparatus wherein an electronic component is mounted in the package for packaging the electronic component of claim 4.

7. A wiring board, comprising:
an insulating base having an electronic component-mounting portion in an upper surface thereof; and
a plurality of connecting pads arranged in a peripheral portion of a lower surface of the insulating base,
in which a plurality of groove-like recesses are formed in the insulating base and the plurality of connecting pads, each groove-like recess extending in a vertical direction and having an inner wall surface with a conductor adhered thereon, and
in which a connecting pad located in a corner has more than one said groove-like recess formed therein which includes a respective groove-like recess located in the respective corner thereof.

8. The wiring board according to claim 7, in which the connecting pad located in the corner has three of said groove-like recesses formed therein which include the groove-like recess located in the respective corner thereof.

9. The wiring board according to claim 7, in which each of four corners at the lower surface of the insulating base has a respective corner connecting pad located thereat and in which each said corner respective connecting pad has three of said groove-like recesses formed therein which include a corner groove-like recess located in the respective corner thereof.

* * * * *